United States Patent [19]
Fukumoto

[11] 4,079,369
[45] Mar. 14, 1978

[54] LIQUID CRYSTAL DISPLAY DEVICE

[75] Inventor: Shigeru Fukumoto, Kobe, Japan

[73] Assignee: Japan Suncrux Co., Ltd., Tokyo, Japan

[21] Appl. No.: 654,408

[22] Filed: Feb. 2, 1976

Related U.S. Application Data

[63] Continuation-in-part of Ser. No. 433,352, Jan. 14, 1974, abandoned.

[30] Foreign Application Priority Data

Dec. 19, 1973 Japan .................. 48-143331

[51] Int. Cl.$^2$ .............. G06K 15/18; G02F 1/13; G04C 17/00
[52] U.S. Cl. .............. 340/324 M; 58/50 R; 350/332
[58] Field of Search .............. 350/160 LC; 58/50 R; 340/336, 324 M

[56] References Cited

U.S. PATENT DOCUMENTS

| | | | |
|---|---|---|---|
| 3,540,209 | 11/1970 | Zatsky et al. ............ | 350/160 LC |
| 3,898,642 | 8/1975 | Dorey et al. ............ | 350/160 LC |
| 3,902,169 | 8/1975 | Washizuka ............ | 350/160 LC |
| 3,903,518 | 9/1975 | Hatsukano ............ | 340/336 |

Primary Examiner—David L. Trafton
Attorney, Agent, or Firm—Auslander & Thomas

[57] ABSTRACT

An electro-optical display device comprising a multitude of liquid crystal display elements arranged in a predetermined order to represent analogically expressed quantity by counting numbers of said display elements sequentially and accumulatively turning on. Said display elements include a layer of liquid crystal material confined between a pair of electrodes. On the one side of said pair of electrodes one pulse signal is applied transmitted selectively from a plurality of different pulses and on the other side of said pair of electrodes another pulse signal is applied transmitted selectively from a plurality of different pulses. The combination of said two selected pulses produces a plurality of combined pulses equivalent to an alternating current pulse which have a certain effective value of a voltage. Said combined pulses are divided into two pulse combinations, one of which comprises an excitation voltage to fully excite said liquid crystal material for turning ON said display elements, the other of which comprises an excitation voltage not to excite said liquid crystal material for turning OFF said display elements. Said selected combined pulses are applied continuously across each of said pair of electrodes and switched sequentially and cyclically into another combined pulses selected respectively by means of a switching operation.

24 Claims, 21 Drawing Figures

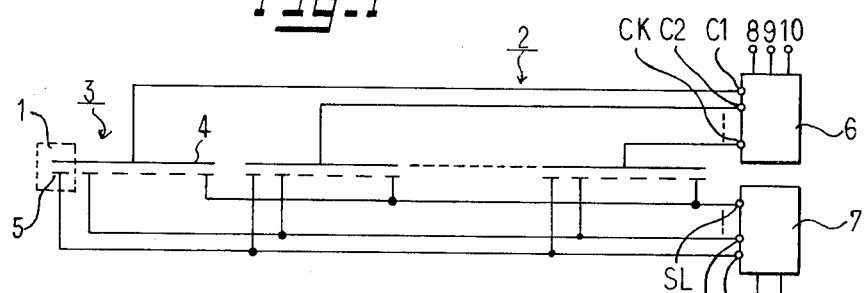
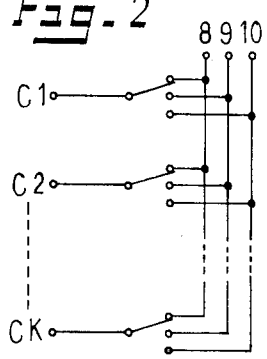
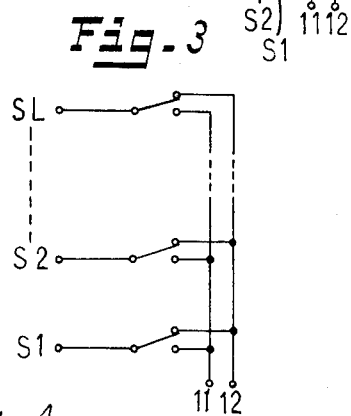
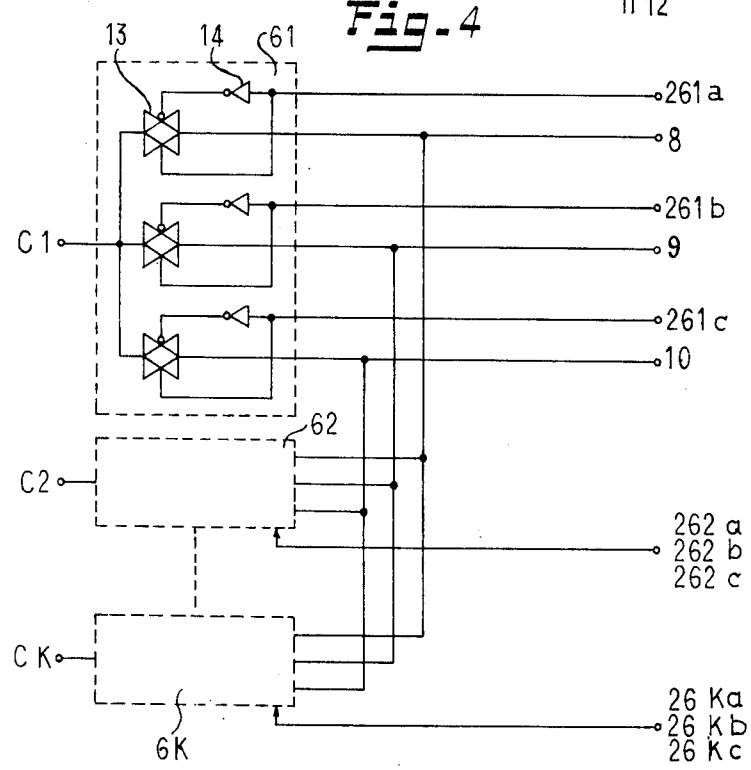

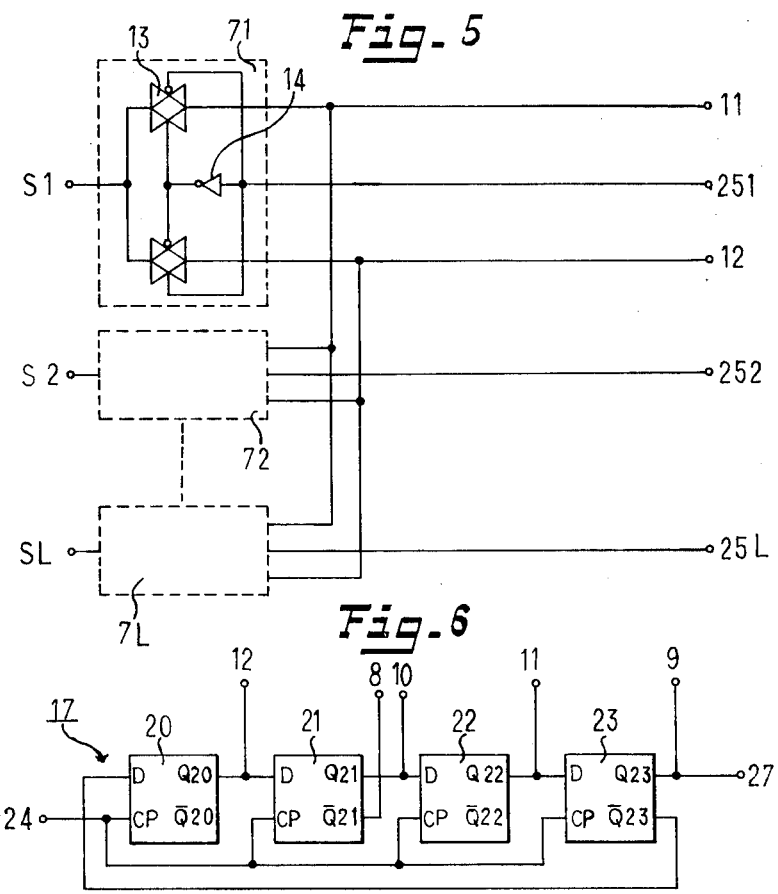
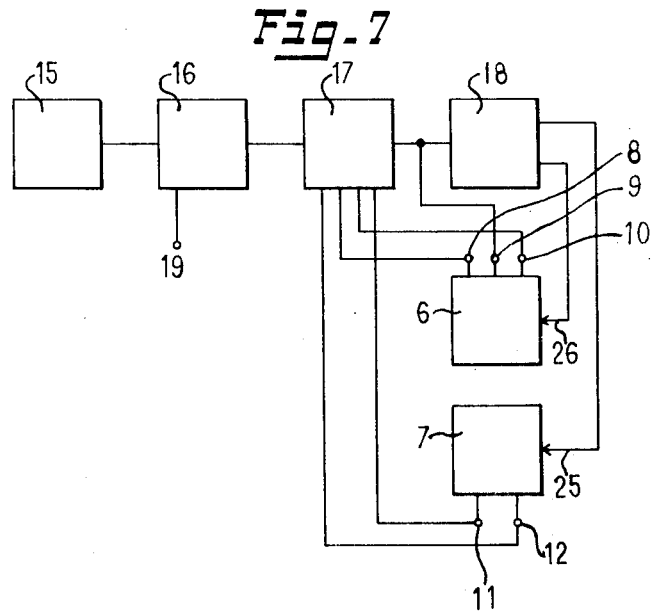

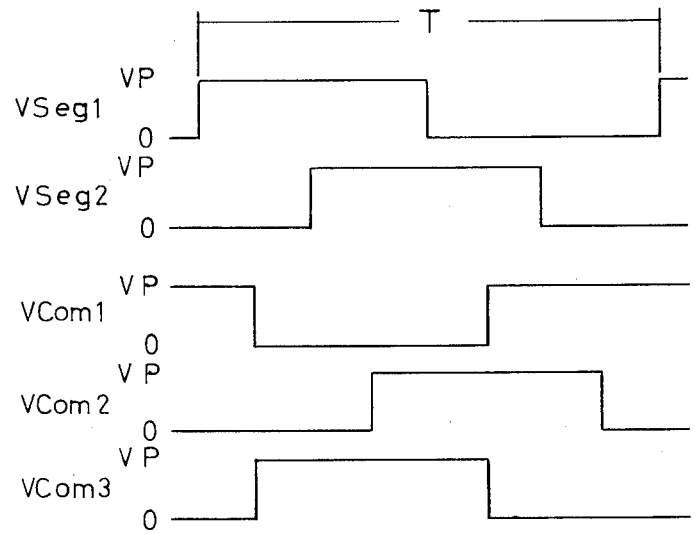
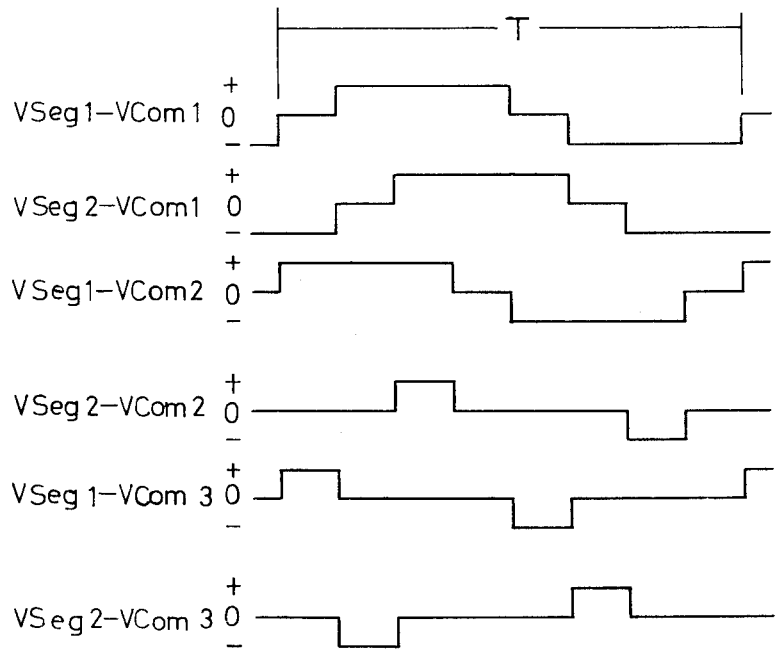

Fig.10
| Common \ Segment | Vcom 1 | Vcom 2 | Vcom 3 |
|---|---|---|---|
| V Seg 1 | ON | ON | OFF |
| V Seg 2 | ON | OFF | OFF |
Fig.11
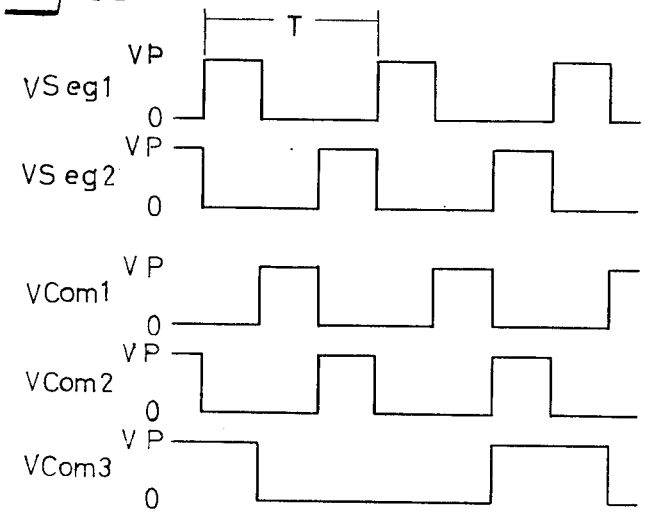
Fig.12
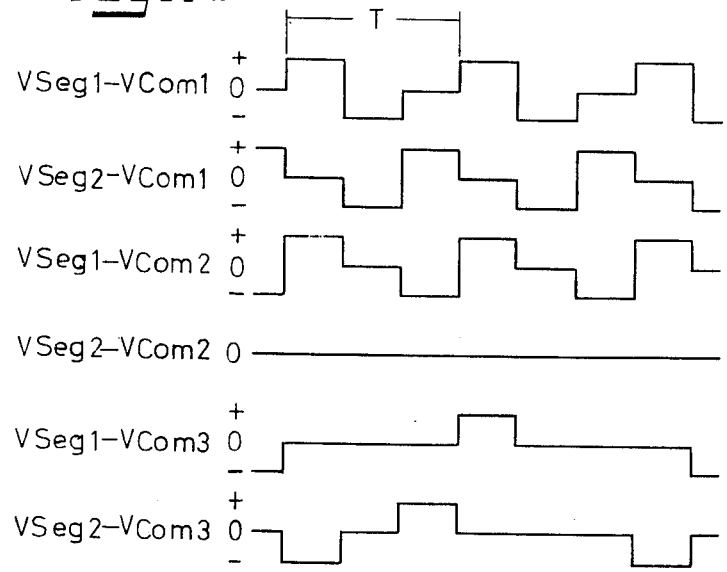

LIQUID CRYSTAL DISPLAY DEVICE

BACKGROUND OF THE INVENTION

This application is a continuation-in-part of application Ser. No. 433,352 filed Jan. 14, 1974, now abandoned.

This invention relates to a novel electro-optical display device which involves a great number of liquid crystal display elements arranged in a predetermined order in a display cell, and wherein said elements are activated selectively and sequentially by an electrically controlled circuit so as to make an analogical fashion display, wherein a number of display elements can be turned ON sequentially one by one and keep the ON states accumulatively.

Recently, liquid crystals have been developed and employed in transmissive, reflective, or absorptive type flat panel displays utilizable for a light shutter or other applications. So far the classes of liquid crystal materials have been identified to be of three types: the cholesteric, the nematic and the smectic. Of the three types of liquid crystal materials, nematic liquid crystals have properties suitable for use in the device of the present invention. This nematic liquid crystals are further subdivided into two classes, the one is Dynamic Scattering Mode (DSM), and the other is Field Effect Mode (FEM). The Field Effect Mode liquid crystals are further classified into two types, i.e., the one is the liquid crystal with positive dielectric anisotropy and the other is the liquid crystal with negative dielectric anisotropy. Especially, the former one is called as a Twist Nematic Liquid Crystal.

These nematic liquid crystals are excited to exhibit a peculiar electro-optical effect, when either a Direct Current (DC) voltage or an Alternating Current (AC) electric signal is applied across a display cell composed of a pair of electrode plates and a liquid crystal material filled in-between. This electro-optical effect of the liquid crystal can be utilized as an effective display means. In the DSM type liquid crystal, as an electric voltage is applied thereacross, an electric field is induced in the liquid crystal to cause a turbulent movement of its molecules so that the incident lights are reflected at the cell in different directions, which is referred to as Dynamic Scattering Effect.

Whereas in the FEM type liquid crystal, as an electric voltage is applied across the liquid crystal layer, movement in the orientation of its molecules is caused. By the aid of a pair of polarlizers, this change can be observed and its physical aspect is utilized as an effective display.

Electric signals utilized for exciting such liquid crystal materials may be either a DC voltage supplied by a power cell or AC voltage which can be obtained from commercially available power sources. However, an electric signal in the form of a pulse with a constant voltage is preferred in application for this purpose. Such an electric signal is usually a DC pulse. However, as its nature, liquid crystal keeps longer life when driven by an alternating electric signal. Therefore, it is more advantageous to drive the liquid crystal by equivalent of AC voltage composited with such DC pulses.

For convenience in the explanation to follow, here is defined respectively terms "ON" to mean the state wherein the liquid crystal is excited to cause a display activity, and "OFF" represents the state wherein it is in quiescent condition and no display activity is performed. In the present invention, each of the liquid crystal display elements is adapted to be turned ON one after another in the predetermined sequence, and remains in the ON state to represent an accumulative display. Therefore, a quick and direct readout in analogue fashion can be obtained by glancing the display face and recognizing the number of display elements thus excited and in the ON state. This means that in place of alphanumerical time display in now commercially available digital watches, a unique time display representing analogically time indication in analogous to the watch hands in conventional timepiece has been realized.

Liquid crystal material requires such a specific voltage value of its own as sufficiently strong enough to excite it in accordance with its property, which is called a threshold voltage. Further, even if a voltage greater than this threshold voltage is applied across the liquid crystal material, it is not until a certain duration of time (referred to as the response time of the liquid crystal) has passed that it is excited to become to the "ON" state. Herein, the response time of the liquid crystal means the rising time and the falling time thereof; the rising time represents a length of time when it takes for the liquid crystal to attain to be fully in the excited state by the application of the required voltage, and the falling time is a length of time when it takes for the liquid crystal to be back from the excited state to the quiescent state by the removal of such applied voltage.

Between these two parameters, there is a correlationship such that the higher the voltage applied, the shorter the rising time. Consequently, the excitation voltage of a certain liquid crystal material is to be determined by both the strength of the voltage applied and the duration of time during which the liquid crystal is subjected to such a voltage. Therefore, the excitation voltage to turn ON the liquid crystal display elements means that the voltage which is greater than the threshold voltage of the liquid crystal is applied and the application of such a voltage maintains for the duration longer than the response time of the liquid crystal at such an applied voltage level. Whereas, the excitation voltage for turning OFF the display element represents the case either the applied voltage is lower than the threshold voltage, or even if the applied voltage is higher than the threshold, the time duration of the application of such a voltage is shorter than the response time of the liquid crystal at this applied voltage. The drive pulse of liquid crystal employed in the present invention has the excitation voltage which satisfies the above-mentioned requirements. Therefore, here we define a pulse with such an effective value of the voltage as to sufficiently make the excitation of the liquid crystal to be "a turn-ON pulse" and a pulse without such an effective value of the voltage to be "a turn-OFF pulse".

In the display device which comprises a number of liquid crystal display elements, these elements are composed of a layer of liquid crystal material confined between a pair of electrodes. Said electrodes pairs are provided with generally one common electrode and a plurality of segment electrodes. Further, one terminal lead is brought out from said common electrode and each one terminal lead is brought out from the respective segment electrodes. These leads are connected respectively to the predetermined switching means corresponding to said electrodes. By the operation of said individual switching means, each display elements can be driven and turned ON or OFF. When one display element is turned ON, a predetermined voltage is applied to said display element so that an electric field may be produced between said pair of electrodes and the liquid crystal can be fully excited to represent an electro-optical display. When one display element is turned OFF, no voltage is applied to said display element whereby an electric field is not produced between said pair of electrodes and the liquid crystal maintains the quiescent state to represent no display activity.

In order to excite the liquid crystal and drive the display element for turning ON or OFF, there have been developed two main conventional driving techniques; one is the Static Drive Method and the other is the Dynamic Drive Method. In the case of the Static Drive Method, a predetermined voltage of either DC or AC signal is continuously applied to a pair of electrodes for a certain duration of time, and by producing potential difference between said electrode pairs at all times while said voltage is applied, the display element is able to maintain the excited state of the liquid crystal so as to turn ON the display element. In the case of the Dynamic Drive Method, it is only for a momentary duration of time that a predetermined voltage is applied across one of the display elements, and the display element can be turned ON only for said momentary duration of time. But such a voltage is applied repeatedly every predetermined time intervals so long as the display element is required to remain in the ON state. By the switching operation of which such application of the voltage is repeated cyclically, especially at very high speed, it produces the effect that the display element subjected to said voltage looks like being in the continuous ON state because flickering of the display activity cannot be observed by the human eyes.

Referring to such conventional display devices which are provided with the above-mentioned drive methods, if a great many of display elements are intended to be controlled sequentially in order to perform an effective display information, the switching operation will be much complicated. That is the reason that it is necessary to select sequentially the display elements to be displayed again and again everytime the display information is desired to be changed. Moreover, the great number of leads and switches are necessary because the same number of leads as the total number of a common electrode and a plurality of segment electrodes are required, and the same number of switches as the number of said segment electrodes are required.

For the purpose of reducing the number of such leads and switches, a matrix scanning method has been developed and utilized. In this matrix scanning method, all the display elements are provided at the intersections formed by a number of row electrodes and column electrodes. Therefore, the respective number of the leads and switches needed for this method is sufficient for the sum of the number of the rows and columns. With respect to the switching operation of this method, when row selector circuits select the required row, electrodes for energizing their conductive lines of electrodes, column selector circuits select the required columns electrodes, sequentially one after another in a predetermined order. Therefore, in this switching technique, it is only one display element or a few display elements positioned on one conductive line electrode that can be selected to be turned ON in a certain moment.

On the contrary, when an accumulative and sequential activation of the display elements is intended in the application of this matrix arrangement, a time sharing drive method equipped with a multiplex switching operation must be employed. However, in the case of which a great number of liquid crystal display elements are needed to be controlled, this time sharing drive method cannot be utilized in the practical application, because the time duration when each display element receives an applied voltage is extremely reduced, and the liquid crystal cannot respond to such a short applied voltage. This will result in little or no excitation of the liquid crystal, so that the display element cannot be fully turned ON.

By eliminating the above mentioned defects of the conventional display techniques, the present invention presents a novel and progressive display device wherein a great number of liquid crystal display elements can be activated to be turned ON sequentially and accumulatively one by one in a predetermined sequence, and the display elements being in the turned ON states exhibit an analogical fashion display. Accordingly, said conventional matrix scanning method and the time sharing drive method cannot be utilized for the present invention.

SUMMARY OF THE INVENTION

The liquid crystal display device of this invention provides a great many liquid crystal display elements employing a multitude of segment electrodes and suitable numbers of common electrodes, which are arranged oppositely on the inner surfaces of a pair of electrode plates. A group of segment electrodes partitioned in suitable numbers of blocks are located at positions corresponding to each of common electrodes. A plurality of pertinently selected pulses are applied respectively to every segment electrode and a plurality of pertinently selected pulses are applied to every common electrode. These pulses are provided with different pulses, for example, different phases, waveforms, time periods or amplitude. The combination of two pulses, namely one pulse signal applied selectively to selected segment electrodes and one pulse signal applied selectively to selected common electrodes, will produce a plurality of combined pulse signals with a certain effective value of the voltage. These combined pulses are divided into two groups; one is that the effective value of the voltage is above the threshold level within the response range of the liquid crystal available for turning ON said elements, and the other is that the effective value of the voltage is below the threshold level to attain to the response range of the liquid crystal available for turning ON said elements. Further, one pulse signal is applied selectively to selected segment electrodes from a plurality of different pulses and one pulse signal is applied selectively to selected common electrodes. The selected pulses are switched sequentially and cyclically into another pulse signal to be selected respectively. Further, this invention provides a liquid crystal display device wherein a great number of display elements are divided into a plurality of desired blocks and preferred numbers of segment electrodes included in each block are interconnected electrically through leads to corresponding segment electrodes in another block one after another so that the same numbers of leads derived from segment electrodes thereof are brought out and then each one of said leads passes through all said blocks to interconnect each segment electrode one after another. The segment electrodes are symmetrically positioned with respect to each boundary of said blocks. The leads extend individually to pertinent switch means. The connection lines can be designed not to cross over another connection line on the surface of the electrode plate and the numbers of leads and switches can be extremely reduced.

Still further, this invention provides a display device wherein part of driving circuits to activate the liquid crystal display elements can be constructed by the use of Large Scale Integrated Circuit (=LSI). Said driving circuits can be provided with wholly electronic components and the reduction of the numbers of the leads and switches is accomplished satisfactorily.

It is therefore an object of the present invention to provide a novel liquid crystal display device comprising a novel driving device for liquid crystal display elements.

It is another object of the invention to provide the display device comprising a great number of liquid crystal display elements arranged in a predetermined order to represent analogically expressed quantity by counting numbers of said display elements sequentially and accumulatively turned ON.

It is still another object of the invention to provide the display body wherein the numbers of the required leads to be connected between the liquid crystal display elements and the driving device for the liquid crystal can be reduced to a great extent as compared with conventional display devices.

It is a further object of the invention to provide the display device wherein the numbers of the required switches to select a set of the applied pulses to the respective common and segment electrodes selected separately can be reduced to a great extent as compared with conventional display devices.

It is still a further object of the invention to provide the display device wherein the switching means to select a set of separate applied pulses from a plurality of different pulses for every display element is provided with an electronic switching device.

It is still a further object of the invention to provide the display device wherein the operation of said electronic switching device is controlled by control pulse signals transmitted from a counter circuit.

It is still a further object of the invention to provide the display device wherein the driving device for the liquid crystal includes a Large Scale Integrated Circuit.

BRIEF DESCRIPTION OF THE DRAWINGS

Other objects and advantages of this invention will become apparent upon reading the attached detailed description and upon reference to the drawings in which:

FIG. 1 shows the interconnection between the display elements comprising segment and common electrodes and the switching means.

FIG. 2 is a mechanical switching means for common electrodes.

FIG. 3 is a mechanical switching means for segment electrodes.

FIG. 4 is a schematic diagram showing one embodiment of an electronic switching means for common electrodes.

FIG. 5 is a schematic diagram showing one embodiment of an electronic switching means for segment electrodes.

FIG. 6 is a block diagram of one embodiment of the first counter circuit.

FIG. 7 is a block diagram of the driving device for liquid crystal display elements.

FIG. 8 is a time chart of five kinds of different pulses transmitted from the first counter circuit shown in FIG. 6.

FIG. 9 is a time chart of the combined waveforms which are produced by the combination of two pulses selected from each group of pulses shown in FIG. 8.

FIG. 10 is a table showing turning ON or OFF of the display elements due to the combination of two pulses, one pulse selected for common electrodes and one pulse selected for segment electrodes.

FIG. 11 is a time chart showing another embodiment of other combinations of five kinds of different pulses.

FIG. 12 is a time chart of the combined waveforms which are produced by the combination of two pulses selected from each group of pulses shown in FIG. 11.

DETAILED DESCRIPTION OF THE INVENTION

Figure 13:
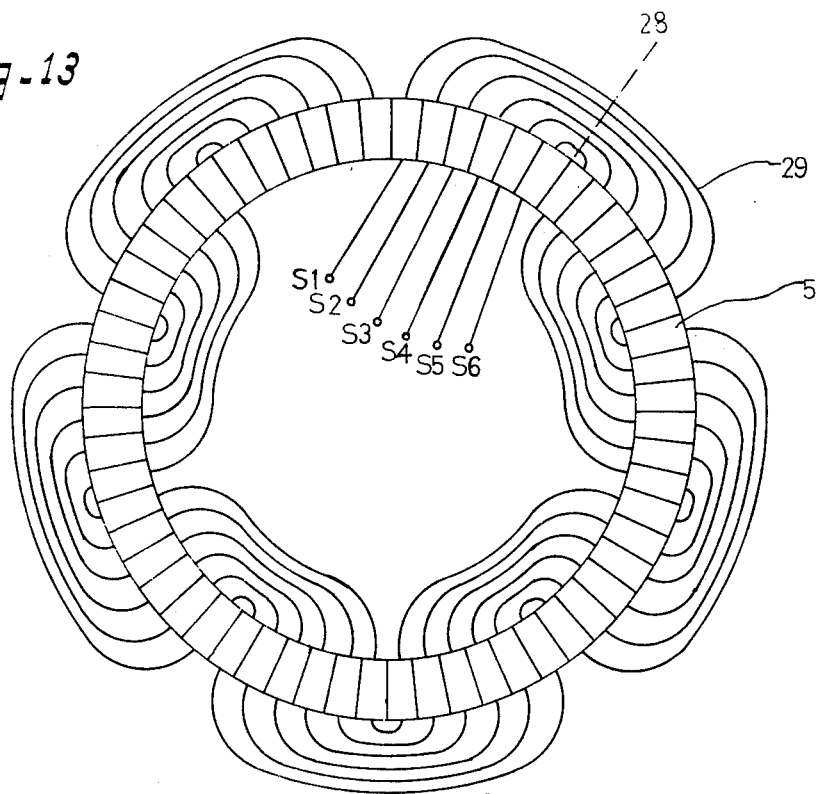
FIG. 13 shows the interconnection of the segment electrodes in one block and the corresponding segment electrodes in another block which are arranged circularly in the order of turning ON so as to apply liquid crystal display elements for minutes indication of horologes.

Referring now to FIG. 1, a display body 2 is composed of a large number of display elements disposed in order of turning ON which are constructed by confining liquid crystal material between a pair of electrodes plates that are divided into preferred numbers of blocks 3 so that each block includes preferably equal numbers of the display elements 1.

Assuming that the display body 2 is composed of M pieces of display elements 1, it is provided with K blocks 3 each of which comprises L display elements 1. Further, in the form of each block 3, display elements 1 included in one block 3 are formed of a liquid crystal layer confined between a pair of electrodes so that each common electrode 4 . . . is situated on the opposite side of corresponding L pieces of segment electrodes 5, . . . arranged in the respective block 3. Said each common electrode 4, . . . is respectively connected electrically through a set of leads into corresponding output terminals C1, C2, . . . CK derived from the multiplexing switch device 6 which is employed to switch sequentially and cyclically the application of selected pulses to the common electrodes 4. Said segment electrodes 5 within the individual block 3 are not only interconnected electrically through a set of leads with corresponding segment electrodes 5 respectively within another block 3 one after another, but the common connection leads are brought out from these said leads so as to contact with the separate output terminals S1, S2, . . . SL derived from the multiplexing switch device 7 which is employed to switch sequentially and cyclically the application of selected pulses to the segment electrodes 5. In one embodiment of this invention, said multiplexing switch 6 is considered to comprise three input terminals 8, 9 and 10 for the application of three kinds of different pulse signals to the respective common electrodes 4, and said multiplexing switch 7 comprises two input terminals 11 and 12 for the application of two kinds of different pulse signals to the respective segment electrodes 5. These multiplexing switches 6 and 7 can be provided with mechanical switching devices utilizable to control as shown in FIG. 2 and FIG. 3, but preferably it is best to control these switching devices with electronic switching components.

Such electronic switching units are formed with suitable numbers of transmission gates 13 and inverters 14, for example, as shown in FIG. 4 and FIG. 5.

FIG. 4 illustrates that the whole multiplexing switch 6, which is partially illustrated, provides K sets of three bilateral switches 61, 62, . . . 6K which are equipped with output terminals C1, C2, . . . CK respectively to transmit one pulse signal selected out of the input terminals 8, 9 and 10 to common electrodes 4 separately. The individual three bilateral switch sets 61, 62, . . . 6K consist of three transmission gates 13 connected in parallel to one another. Each respective transmission gate 13 is connected to an inverter 14 arranged in parallel in order to control the transmission gate 13 by the application of complementary input signals to input terminals for controlling the gate 13.

On the other hand, FIG. 5 illustrates that the whole multiplexing switch 7, which as partially illustrated, provides L sets of two bi-directional switches 71, 72, . . . 7L which are equipped with output terminals S1, S2, . . . SL respectively to transmit one pulse signal selected out of the input terminals 11 and 12 to segment electrodes 5 separately. The individual sets of two bi-directional switches 71, 72, . . . 7K consist of two transmission gates connected in parallel to each other, and the respective transmission gates 13 are connected to an inverter 14 arranged in parallel in order to control the transmission gates 13 by the application of complementary input signals to input terminals for controlling the gate.

As shown in FIG. 7, the multiplexing switch 6 is operated by the control pulse signals transmitted by way of the input terminal 26 from the second counter circuit 18 and are supplied with three kinds of pulse signals for driving display elements through input terminals 8, 9 and 10, which are respectively connected to the output terminals of each stage of flip flop circuits established in the first counter circuit 17. The multiplexing switch 7 is operated by the control pulse signal transmitted by way of the input terminal 25 from the second count circuit 18 and are supplied with two kinds of pulse signals for driving display elements 1 through input terminals 11 and 12, which are respectively connected to the output terminals of each stage of flip-flop circuits established in the first counter circuit 17.

One embodiment of this first counter circuit 17 is shown having Delay Type flip-flop circuits shown in FIG. 6. This first counter circuit 17 comprises a four stage Johnson Counter, which consists of a series of four flip-flops 20, 21, 22 and 23. These flip-flop circuits 20, 21, 22 and 23 work on the Master-Slave principle as a shift counter to provide output signals at a determined rates. The input terminal 24 of the first counter circuit 17 is connected to the output terminal of the frequency divider 16 which is employed to count down high frequencies transferred from the oscillator 15 into low frequencies within the response region of the liquid crystal. The ouput terminal Q 20 of the first stage flip-flop 20 is connected to the input terminal 12 of said multiplexing switch 7 so that output pulse signals for driving display elements 1 are applied to desired segment electrodes 5. Likewise hereinafter the output terminal Q21 of the second stage flip flop 21 is connected to the input terminal 10 of said multiplexing switch 6. The output terminal $\overline{Q21}$ of the second-stage flip flop 21 is connected to the input terminal 8 of the multiplexing switch 6 so that the respective output pulse signals for driving display elements 1 are applied to desired common electrodes 4 separately via C1–CK.

Further, the output terminal Q22 of the third stage flip-flop 22 is connected to the input terminal 11 of the multiplexing switch 7 so that the output pulse signals for driving display elements 1 are applied to desired segment electrodes 5, and the output terminal Q23 of the fourth stage flip-flop is connected to the input terminal 9 of the multiplexing switch 6 so that output pulse signals are applied to desired common electrodes 4. These output pulse signals transmitted from these output terminals Q20, Q21, Q22 and Q23 comprise respectively different phases delayed by one-eighth periods one after another in that order. The output pulse signal transmitted from the output terminal $\overline{Q21}$ is of a different phase delayed by one-half period from the output pulse signal of output terminal Q21.

These output pulse signals are applied to common and segment electrodes 4 and 5 separately for driving display elements 1. As shown in FIG. 8, the output pulse signals to be transmitted to the input terminals 8, 9 and 10 of the multiplexing switch 6 for common electrodes 4 become respectively the drive pulse signals VCom 1, VCom 2, and VCom 3, which comprise respectively different phase delayed by one-fourth periods one after another in that order and the output pulse signals to be transmitted to the input terminals 11 and 12 of the multiplexing switch 7 for segment electrodes 5 respectively become the drive pulse signals VSeg 1 and VSeg 2 which are different phases advanced by one-fourth periods one after another in that order.

These output pulse signals are in the form of direct current pulses with each cycling at T time intervals. One of three kinds of these pulse signals VCom 1, VCom 2 and VCom 3 is associated respectively with one of two kinds of the pulse signals VSeg 1 and VSeg 2 in six kinds of types of the combinations of two selected pulses.

These combinations of two pulses produce six kinds of potential differences between common and segment electrodes 4, 5 as shown in FIG. 9. Namely, six resultant waveforms, the combination of the pulse signals VSeg 1 and VCom 1, the combination of the pulse signals VSeg 2 and VCom 1 and the combination of pulse signals VSeg 1 and VCom 2 create the effective value of the voltage at a rate of three-fourths of the VP (VP means the peak value of a voltage) which is above the threshold voltage for the liquid crystal, and the combination of the pulse signals VSeg 2 and VCom 2, the combination of the pulse signals VSeg 1 and VCom 3 and the combination of the pulse signals VSeg 2 and VCom 3 create the effective value of the voltage at a rate of one-fourth of the VP which is below the threshold voltage for the liquid crystal. Therefore, when the effective value of the voltage applied between segment and common electrodes 4 and 5 is one-half of the VP, the applied voltage becomes sufficient to attain to the required threshold voltage for the liquid crystal. The observer will see the display elements 1 turn ON or OFF in accordance with the six kinds of the combinations of pulses as shown in the table in FIG. 10. In this table ON represents that the display elements 1 are in turn ON state and OFF represents that the display elements 1 are in turn OFF state.

As mentioned in the above description, three kinds of the pulse signals are selected respectively from a plurality of pulses for energizing common electrodes 4 and two kinds of the pulse signals are selected respectively from a plurality of pulses for energizing segment electrodes 5, wherein the waveforms of the individual pulse signal comprise different phases delayed or advanced by one-fourth periods from one after another in the respective group of the pulse signals, which are employed to drive the display elements 1 for turning ON or OFF.

The effective value of the voltage created by the resultant waveforms due to the combinations of two pulses, which are selectively applied to common electrodes 4 and segment electrodes 5 respectively, produces not only the first state that the effective value of the voltage becomes a voltage above the threshold level for liquid crystals but also the second state that the effective value of the voltage becomes a voltage below the threshold level for liquid crystals. Such combinations of two pulses selected from a plurality of pulses will be sufficient to drive the display elements 1 so as to be turned ON or OFF. Therefore, only if the pulse signals selected from a plurality of pulses individually satisfy the above conditions, the selected pulses applied to common and segment electrodes 4 and 5 can be utilized for driving the display elements and if such pulses include a set of selected pulses comprising different phases, different time periods or different waveforms from one another, such signals may be employed for the display information of the present invention. Furthermore, a set of selected pulses to be utilized may comprise different members of pulses from a set of pulses of the above embodiment.

FIG. 11 illustrates another embodiment of this invention as to the combination of pulses. Compare the waveforms of three kinds of the selected pulse signals VCom 1, VCom 2 and VCom 3 and two kinds of the selected pulse signals VSeg 1 and VSeg 2 to one another. These selected pulse signals are provided to comprise five kinds of waveforms which are composed of one-third pulse width to the repeated time periods respectively. The pulse signals VSeg 1 and VSeg 2 comprise different phases delayed by two-third periods one after another in that order, the pulse signals VCom 1 and VCom 2 comprise different phases delayed by one third periods one after another in that order and the pulse signal VCom 3 is provided to comprise a waveform of twice the time period and twice the pulse width as compared with the pulse signals VCom 1 and VCom 2. The combinations of said pulse signals between either VSeg 1 or VSeg 2 to be applied selectively to each of the segment electrodes 5 and either VCom 1, VCom 2 or VCom 3 to be applied selectively to each of the common electrodes 4 produce six combinations of two pulses, which appear as six potential differences between common and segment electrodes 4 and 5 as shown in FIG. 12. There are three kinds of the combined pulse signals which are produced by the combinations of two pulses, for this example VSeg 1 and VCom 1, VSeg 2 and VCom 1, VSeg 1 and VCom 2 comprise the effective value of the voltage at a rate of two-thirds of the VP to be applied in the alternating field between electrode pairs. The effective value of the voltage acquired by the combined pulse signals to be formed by the combination of the pulse signals VSeg 2 and VCom 2 becomes 0 volt and so display elements 1 turn OFF. Further, two kinds of the combined pulse signals which are produced by the combinations of two pulses, that is, VSeg 1 and VCom 3, VSeg 2 and VCom 3 comprise the effective value of the voltage at a rate of one-third of the VP to be applied in the alternating field between electrode pairs. Therefore, also in this case, when the effective value of the voltage applied in the electric field between electrode pairs is one-half of the VP, the applied voltage is sufficient to attain to the required threshold level for the liquid crystal. The observer will perceive the display elements 1 turn ON or OFF in accordance with the six states as mentioned above.

In still another embodiment of this invention the selected pulses can be provided to comprise the high frequencies in place of said pulse signal VCom 3 so as to make display elements 1 appear in turned OFF state because the liquid crystals cannot respond to the high frequency. In connection with this case, when high frequency pulse signals are employed for the pulse signal VCom 3, whatever other low frequency pulses to be used for the partner pulse signals VSeg 1 or VSeg 2 are supplied in order to combine with high frequency pulse signals which are beyond the response region of the liquid crystals, the combined pulse signals produced by such combinations of said two pulses will create the alternating field created by the applied voltage due to high frequency pulses between electrode pairs, wherein the liquid crystal cannot respond and so display element 1 remain in turned OFF state. As for such high frequency pulse signals, the high frequency pulses generated from the oscillator 15 may be employed directly for useful application, or the high frequency pulses beyond the response region for the liquid crystal transmitted from the output terminal 19 of the intermediate stage in the frequency divider 16 can be utilized effectively. Careful selection of these pulses signals of high frequencies must be established to select suitable pulses to be employed bacause the response region for liquid crystals is different in accordance with the kind of the liquid crystal material.

Now description will be given in detail hereinafter on the operation of the driving parts of the display device of this invention. The oscillator 15 continuously generates oscillations at a fixed frequency. These oscillations drive the frequency divider 16 and the latter counts down and produces low frequency pulses which are sufficient to be within the response region for the liquid crystals. Said low frequency pulses produced by the frequency divider 16 are transmitted to the input terminal 24 of the first counter circuit 17. Further, these high frequency pulses which are beyond the response region of the liquid crystal can be acquired from the output terminal 19 of the intermediate stage in the frequency divider 16. The low frequency pulses transmitted to the input terminal 24 of the first counter circuit 17 are employed for the clock pulses for each stage of the flip-flops 20, 21, 22, 23. The first counter circuit 17 produces successive counts and produces several outputs. The output signals transmitted from the output terminals Q20, Q21, Q22 and Q23 comprise respectively different phases delayed by one-eighth periods one after another in that order. The output signal transmitted from the other output terminals $\overline{Q}20, \overline{Q}21, \overline{Q}22, \overline{Q}23$ are of different phases delayed by one-half periods from the output signal of the output terminals Q20, Q21, Q22, Q23. The output transmitted through the output terminal 27 of the first counter circuit 17 is supplied to the second counter circuit 18. Said second counter circuit 18 may comprise Johnson Counters which include a series of Delay-Type flip-flops or a series of J-K Master Slave flip-flops with suitable numbers of stages. The control pulse signals transmitted from the output terminals of each stage flip-flop are supplied to the respective transmission gates 13 by way of the input terminals 25 or 26 in the multiplexing switches 6 or 7 so as to control the operation of the respective transmission gates 13.

As shown in FIG. 4, each of the multiplexing switch units 61, 62, . . . 6K is provided with three bilateral switches comprising three transmission gates 13 and three inverters 14. For instance, the multiplexing switch units 61, 62, . . . 6K are supplied with three kinds of the control pulse signals by way of three input terminals (261A, 261B, 261C), (262A, 262B, 262C), . . . and (26KA, 26KB, 26KC). When one of three transmission gates 13 is switched ON, the remaining two transmission gates 13 must be switched OFF so that only one selected pulse, that is, the pulse signal VCom 1, VCom 2 or VCom 3 through one of the input terminals 8, 9 and 10 may be transmitted to be applied to the common electrode through the output terminals C1, C2, . . . CK. Therefore, these control pulse signals to be supplied to each of the transmission gates 13 are provided to allow only one transmission gate to be switched ON.

On the other hand, as shown in FIG. 5, each of the multiplexing switch units 71, 72, . . . 7L is provided with two bidirectional switches comprising two transmission gates 13 and an inverter 14. For instance, in the multiplexing switch units 71, 72, . . . 7L the control pulse signal supplied through the input terminals 251, 252, . . . 25L of said multiplexing switches 71, 72 . . . 7L can be employed to allow one of the transmission gates 13 to be switched ON and the other transmission gate 13 being switched OFF so that only one selected pulse, that is, the pulse signal VSeg 1 or VSeg 2 through one of the input terminals 11 and 12 may be transmitted to be supplied to the segment electrode 5 through the output terminals S1, S2, . . . Sl.

In the same manner as above mentioned, the multiplexing switch units 61, 62, 6K operate each of the multiplexing switches to allow only one of the transmission gates 13 thereof to be turned ON so that only one of the pulse signals VCom 1, VCom 2 or VCom 3 may be transmitted to common electrodes 4 through the output terminals C1, C2 . . . CK respectively.

The multiplexing switch units 71, 72 . . . 7L each allow only one of the transmission gates 13 thereof to be turned ON so that only one of the pulse signals VSeg 1 or VSeg 2 may be transmitted to segment electrodes 5 through output terminals S1, S2, . . . SL respectively.

As detailed hereinbefore, there are two advantages which are achieved by constructing the liquid crystal display device in accordance with this invention. One is that the numbers of leads and switches to be connected between the display body 2 and driving circuits can be reduced to a great extent. The second is that the parts of the driving circuits can be constructed with a Large Scale Integrated Circuit because said driving circuits can be provided with wholly electronic components and the reduction of the numbers of leads and switches is accomplished satisfactorily.

Now, as another embodiment, the liquid crystal display device of this invention is applied to the time indication as in horologes, especially minutes indication as will be given in detail hereinafter. As shown in FIG. 13, 60 segment electrodes 5 are circularly disposed and are divided into 10 blocks 3 so that each block 3 includes six segment electrodes 5. Six leads are brought out from six segment electrodes 5 within the initial block 3 so as to be connected to the output terminals S1, S2, . . . S6 of the multiplexing switch 7 respectively.

From the starting points of six segment electrodes 5 located within said initial block 3, six segment electrodes 5 included in each block 3 are interconnected electrically through the connection lines 29 with six segment electrodes 5 located at corresponding positions respectively in the adjacent block 3 one after another. The segment electrodes 5 are symmetrically positioned with respect to each block boundary 28, and said connection lines 29 brought out of each of the six segment electrodes 5 within the initial block 3 pass through all said blocks 3 so as to interconnect in series each of the six segment electrodes 5 within one block 3 with correspondence of six segment electrodes 5 within another block 3 respectively so that six groups of segment electrodes 5 connected in series to one another may be formed.

In such interconnection of electrodes 5, it is advantageous that these connection lines are designed not to cross over another connection line on the surface of an electrode plate where each segment electrode 5 is connected with another one. It is also useful when segment electrodes 5 on the electrode plate are provided with metal films such as tin oxide coated on the electrode plate and the interconnection lines of segment electrodes 5 are likewise provided with metal films or the like coated on the surface of the electrode plate.

Figure 14:
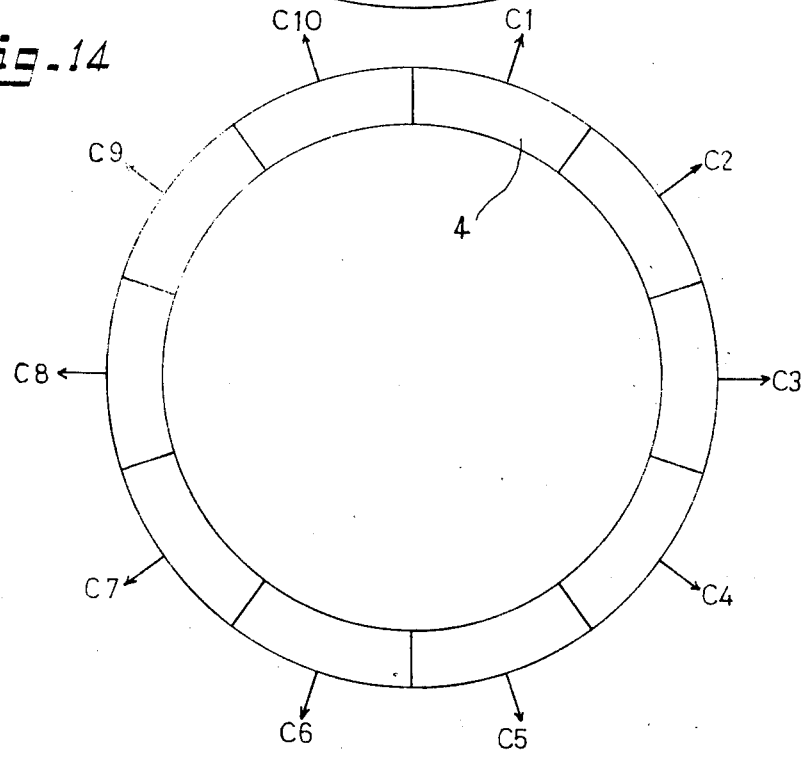
FIG. 14 shows common electrodes which are arranged circularly to be opposite to segment electrodes shown in FIG. 13.

On the other hand, FIG. 14 illustrates that ten common electrodes 4 are arranged oppositely corresponding to ten blocks of said segment electrodes 5. From each of said common electrodes 4 a lead is brought out so as to be connected with one of the output terminals C1, C2, . . . C10 of the multiplexing switch 6 respectively.

Figure 15:
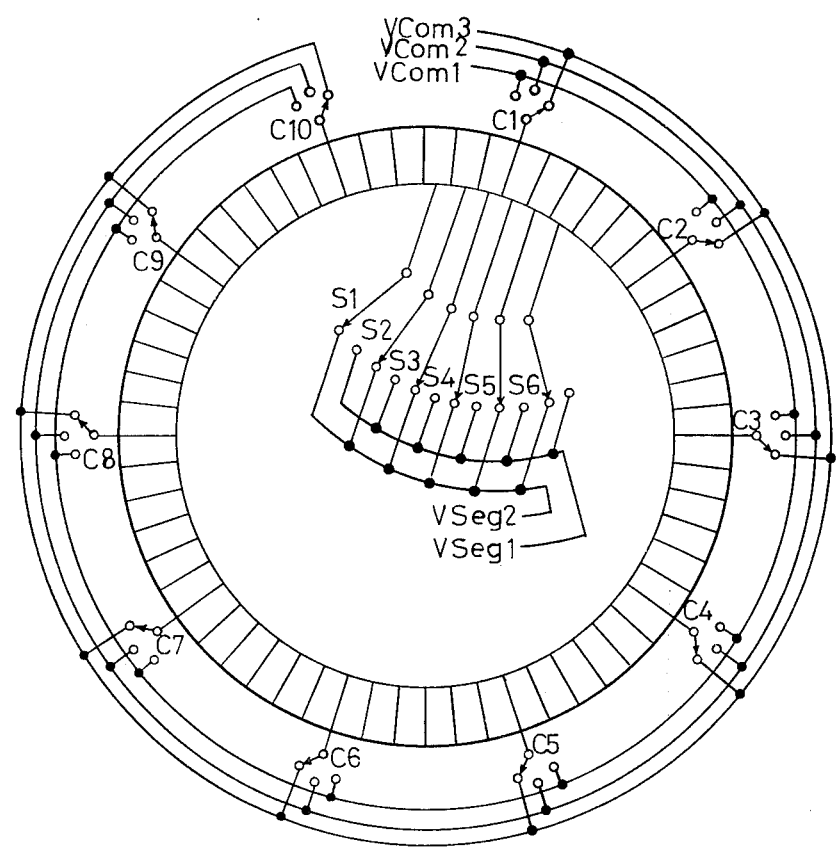
FIG. 15 shows a layout representing segment electrodes shown in FIG. 13 and common electrodes shown in FIG. 14 piled up oppositely.

Liquid crystal display elements 1 are provided in a unit as shown in FIG. 15, wherein each display element 1 is formed by sandwiching liquid crystal material between said segment electrodes 5 and said common electrodes 4.

Figure 16:
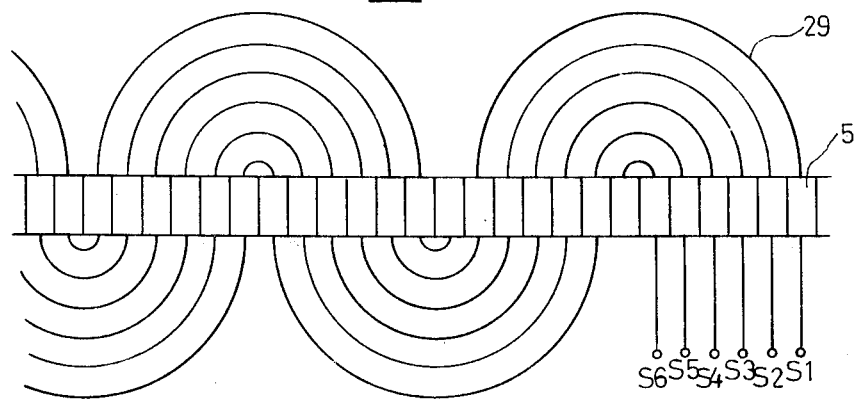
FIG. 16 shows a layout of segment electrodes arranged in a line.

The segment electrode 5 may be disposed in a row as shown in FIG. 16 or may be placed in vertical stack. The segment electrode plate is formed on the surface of the transparent plate by coating transparent conductive materials such as tin oxide, and the common electrode plate is formed on the surface of the transparent or opaque plate according to the purpose by coating transparent conductive materials.

Referring now to FIG. 15, accumulative display operation of the display elements is described hereinafter. At the beginning, all the common electrodes 4 within all blocks 3 of the display body 2 are set to have the pulse signal VCom 3 applied, and all the segment electrodes 5 are set to have the pulse signal VSeg 2 applied. In FIG. 15 all display elements 1 of the display body 2 are in turned OFF state as shown in FIG. 10.

On starting operation, the pulse signal applied to the common electrode 4 (hereinafter referred to as common pulse signal) within the first block 3 is switched from VCom 3 to VCom 2, while the rest of the common electrodes 4 are still being fed with the pulse signal VCom 3. The pulse signal applied to the segment electrodes 5 (hereinafter referred to as segment pulse signal) are switched from VSeg 2 to VSeg 1 one by one in succession through the output terminals S1, S2, ... S6 of the multiplexing switch 7. Then each display element within the first block 3 shifts from the OFF state to the ON state in an accumulative display.

All the corresponding segment electrodes 5 which are symmetrically positioned in the subsequent blocks 3, i.e., from the second block 3 to the tenth block 3 are interconnected electrically through said connection leads 29 in series as stated before. Each corresponding segment electrode 5 receives the same shifted pulse signal VSeg 1, when the pulse signal applied to the corresponding segment electrode 5 in the first block 3 is shifted from VSeg 2 to VSeg 1. However, all common electrodes 4 for these subsequent blocks 3 carry a common pulse signal of VCom 3. Therefore, each display element 1 within the subsequent blocks 3 remains OFF as shown in FIG. 10. When all display elements 1 within the first block 3 have been turned ON, the common pulse signal applied to the first block 3 is switched from VCom 2 to VCom 1, at the same time the segment pulse signal for S1, S2, ... S6 returns from VSeg 1 to VSeg 2 through the multiplexing switch 7. At the same time, the common pulse signal applied to the second block 3 is converted to VCom 2 from VCom 3 and the segment pulse signal is switched from VSeg 2 to VSeg 1 successively in the order of the output terminals S6, S5, ... S1 of the multiplexing switch 7. Then each display element 1 within the second block 3 shifts over from the OFF state to the ON state in an accumulative display. All the while, all display elements 1 within the first block 3 keep ON, because the common electrode 4 of the first block 3 has a pulse signal VCom 1 applied.

In the same manner, when all display elements 1 within the first and the second blocks 3 have been turned ON and the display is accumulated, the common pulse signal for the second block 3 is converted to VCom 1 and simultaneously the segment pulse signal for S6, S5, ... S1 returns to VSeg 2 in like manner as the case of first block 3.

At that time, the common pulse signal for the third block 3 is switched from VCom 3 to VCom 2 and the segment pulse signal is switched from VSeg 2 to VSeg 1 successively in the order of the output terminals S1, S2, ... S6. Then each display element 1 within the third block 3 is turned ON in due order to accumulate the display.

During this time, all display elements 1 within the first and the second blocks 3 remain ON, and all display elements 1 within the subsequent blocks 3 from the fourth to the tenth are in OFF state as shown in FIG. 10 due to the pulse signal VCom 3 being applied to the respective common electrodes 4.

When all display elements 1 within the third block 3 have been turned ON, all display elements 1 within the first through the third blocks 3 remain in ON state so that the display device 2 can maintain an accumulative display.

This process goes forward in the identical manner synchronized with time. The common pulse signals within each block 3 being switched from VCom 3 to VCom 2 and the segment pulse signal being switched from VSeg 2 to VSeg 1 successively, each display element 1 within each block 3 is turned ON in due order. After the ON state has reached the last display element 1 within each block 3 and the moment immediately before the ON state proceeds to the first display element 1 within the next block 3, the common pulse signal and the segment pulse signal of all of the segment electrodes 5 in the preceding block 3 are simultaneously switched respectively from VCom 2 to VCom 1 and from VSeg 1 to VSeg 2, while common pulse signal of the succeeding block 3 is also switched from VCom 3 to VCom 2. In this way, subsequent display elements 1 in OFF state are turned ON successively to make an accumulative display keeping each display element 1 of each block 3 which have already been turned ON in the ON state.

When the ON state of each display element 1 has advanced to cover the final display element 1 in the final block 3, that is, when one cycle of accumulative display is completed, the common pulse signal applied to all the common electrodes 4 of all blocks 3 and the segment pulse signals applied to the segment electrodes 5 are simultaneously switched respectively to VCom 3 and VSeg 2, this returns the display elements 1 to the starting condition. Accordingly, all the display elements 1 are turned OFF at the same time, and simultaneously the first display element 1 within the first block 3 is turned ON thus starting accumulative display again. Such switching operation for the common pulse signals and the segment pulse signals mentioned above are controlled by the control pulse signals transmitted from the output terminals 25, 26 of each stage established in the second counter circuit 18 synchronizing with the time.

Figure 17:
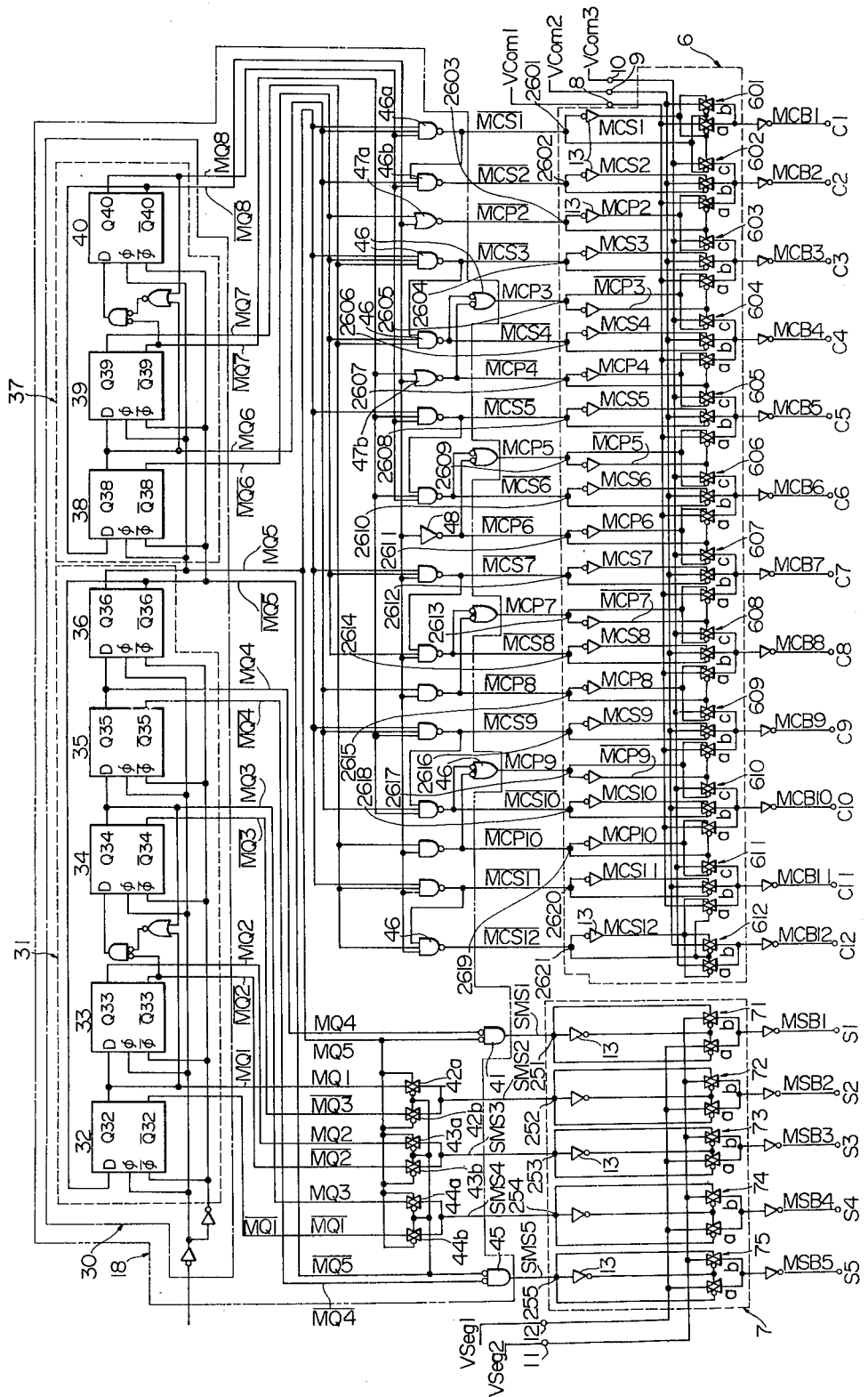
FIG. 17 is a block diagram of one embodiment of the second counter in combination with switching means for the segment electrodes and common electrodes, which may be employed in the system of FIG. 7 in combination with the first counter of FIG. 6, for a display device having the segment electrodes of FIG. 13 and the common electrodes of FIG. 14.

Referring now to FIG. 17, one embodiment of the preferred relationship between the second counter circuit 18 and the multiplexing switch 6 and 7 will now be described in detail. This embodiment is employed for a liquid crystal display device having 60 display elements, especially for a display device having 60 segment electrodes which are divided into 12 blocks as shown in FIG. 13 and 12 common electrodes as shown in FIG. 14, with each block including five segment electrodes and a separate common electrode arranged opposite to each block of five said segment electrodes, so that said 60 display elements can be turned ON one by one every one minute sequentially and accumulatively in order, for example, to employ this display device for minute indication in a timepiece. For the purpose of describing the embodiment applied to the above-mentioned minute indication, the actual construction of this embodiment will be shown for the case wherein the multiplexing switch 7 shown by FIG. 5 is provided with five sets of dual bi-directional switches 71, 72, ... and 75, and the multiplexing switch 6 shown by FIG. 4 is provided with two sets of dual bi-directional switches 601 and 612 and ten sets of triple bilateral switches 602, 603, ... , and 611. The object is to operate the second counter circuit 18 to produce a plurality of control pulse signals which may control and actuate these multiplexing switches 6 and 7 in order that by these switching means the pulse signals VSeg 1 or VSeg 2 are selected respectively and applied to each of the segment electrodes S1, S2, S3, S4, and S5 sequentially and continuously during respectively predetermined intervals in accordance with a time chart shown by FIG. 19, and the pulse signals VCom 1, VCom 2 or VCom 3 are selected respectively and applied to each of the common electrodes C1, C2, . . . , and C12 sequentially and continuously during respectively predetermined intervals in accordance with a time chart shown by FIG. 21.

The control pulse signals for actuating each of the dual bi-directional switches 71, 72, . . . and 75 are respectively the pulse signals SMS1, SMS2, . . . , and SMS5 which are produced and transmitted from the second counter circuit 18. These control pulse signals SMS1, SMS2, . . . , and SMS5 are transmitted respectively to the dual bi-directional switches 71, 72, . . . , and 75 by way of the input terminal 25, namely the input terminals 251, 252, . . . , and 255 thereof. The dual bi-directional switches 71, 72, . . . and 75 are provided respectively with a pair of transmission gates (71a, 71b), (72a, 72b), . . . , and (75a, 75b) and an inverter 13 coupled thereto. These dual bi-directional switches receive the control pulse signals SMS 1, SMS2, . . . and SMS5 respectively and selectively opens the gate of any one of said pair of transmission gates in accordance with the potential level of the applied control pulse signals, so that the pulse signals VSeg 1 or VSeg 2 may pass through the selected transmission gate by way of the input terminals 12 or 11 of the multiplexing switch 7 during the respective predetermined intervals. As a result of the transmission of the pulse signals VSeg 1 and VSeg 2 passing through the gate in turn, the output pulse signals from each of the dual bi-directional switches become the driving pulse signals MSB1, MSB2, and . . . , MSB5 respectively, which are applied to the segment electrodes S1, S2, . . . , and S5 respectively.

The control pulse signals to actuate the dual bi-directional switch 601, the ten sets of triple bilateral switches 602, 603, . . . , and 611, and the dual bi-directional switch 612 are the pulse signals ($\overline{MCS1}$, MCS1), (MCP2, MCS2, MCS1), (MCP3, MCS3, $\overline{MCP2}$), (MCP4, MCS4, $\overline{MCP3}$), (MCP5, MCS5, $\overline{MCP4}$), (MCP6, MCS6, $\overline{MCP5}$), (MCP7, MCS7, $\overline{MCP6}$), (MCP8, MCS8, $\overline{MCP7}$), (MCP9, MCS9, $\overline{MCP8}$), (MCP10, MCS10, $\overline{MCP9}$), (MCS12, MCS11, $\overline{MCP10}$), and (MCS12, $\overline{MCS12}$), respectively. These control pulse signals are produced and transmitted respectively from the second counter circuit 18 to the dual bi-directional switch 601, the triple bilateral switches 602, 603, . . . , and 611, and the dual bi-directional switch 612 by way of the input terminal 26, namely the input terminals (2601, 2601), (2603, 2602, 2601), (2605, 2604, 2603), . . . , (2621, 2620, 2619), and (2621, 2621), of each of the multiplexing switch 6 as shown in detail in FIG. 17. The dual bi-directional switch 601 is provided with a pair of transmission gates 601a and 601b and an inverter 13 coupled to said pair of transmission gates. This dual bi-directional switch 601 receives the control pulse signals ($\overline{MCS1}$, MCS1) and selectively opens the gate of any one of said pair of transmission gates in accordance with the potential level of the applied control pulse signals, so that the pulse signals VCom 1 or VCom2 may pass through the selected transmission gate by way of the input terminals 8 or 9 of the multiplexing switch 6 during the respective predetermined intervals. As a result of the transmission of the pulse signals VCom 1 and VCom 2 passing through the gate in turn, the output pulse signal of the dual bi-directional switch 601 becomes a driving pulse signal MCB1, which is applied to the common electrode C1. Since this common electrode C1 does not need to be applied to the pulse signal VCom 3, the pulse signal VCom 3 is not transmitted from the dual bi-directional switch 601. The triple bilateral switches 602, 603, . . . , and 611 are provided respectively with three transmission gates (602a, 602b, 602c), (603a, 603b, 603c), . . . and (611a, 611b, 611c) and three inverters 13 coupled to said transmission gates. These triple bilateral switches receive respectively the above mentioned control pulse (MCP2, MCS2, MCS1), (MCP3, MCS3, $\overline{MCP2}$), . . . , and (MCS12, MCS11, $\overline{MCP10}$) and selectively open the gate of any one of the said three transmission gates in accordance with the potential level of the applied control pulse signals, so that the pulse signals VCom 1, VCom 2, or VCom 3 may pass through the selected transmission gate by way of the input terminals 8, 9 or 10 of the multiplexing switch 6 during the respective predetermined intervals. As a result of the transmission of the pulse signals VCom 1, VCom 2, and VCom 3 passing through the gate in turn, the output pulse signals of each of the triple bilateral switches becomes the driving pulse signals MCB2, MCB3, . . . , and MCB11 respectively, which are applied to the common electrodes C2, C3, . . . , and C11 respectively. The dual bi-directional switch 612 is also provided with a pair of transmission gates 612a and 612b and an inverter 13 coupled to said pair of transmission gates. This dual bi-directional switch 612 receives the control pulse signals (MCS12, $\overline{MCS12}$) and selectively opens the gate of any one of said pair of transmission gates in accordance with the potential level of the applied control pulse signals, so that the pulse signals VCom 2 or VCom 3 may pass through the selected transmission gate by way of the input terminals 9 or 10 of the multiplexing switch 6 during the respective predetermined intervals. As a result of the transmission of the pulse signals VCom 2 and VCom 3 passing through the gate in turn, the output pulse signal of the dual bi-directional switch 612 becomes a driving pulse signal MCB12, which is applied to common electrode C12. Since this common electrode C12 does not need to be applied to the pulse signal VCom 1, the pulse signal VCom 1 is not transmitted from the dual bi-directional switch 612.

Figure 18:
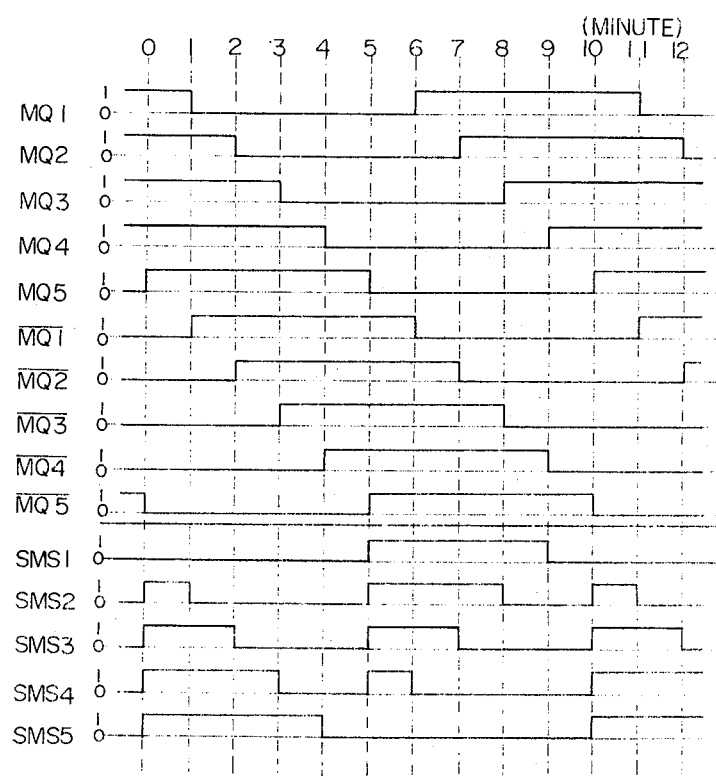
FIG. 18 is a time chart of a group of signals for explaining the system of FIG. 17.
Figure 20:
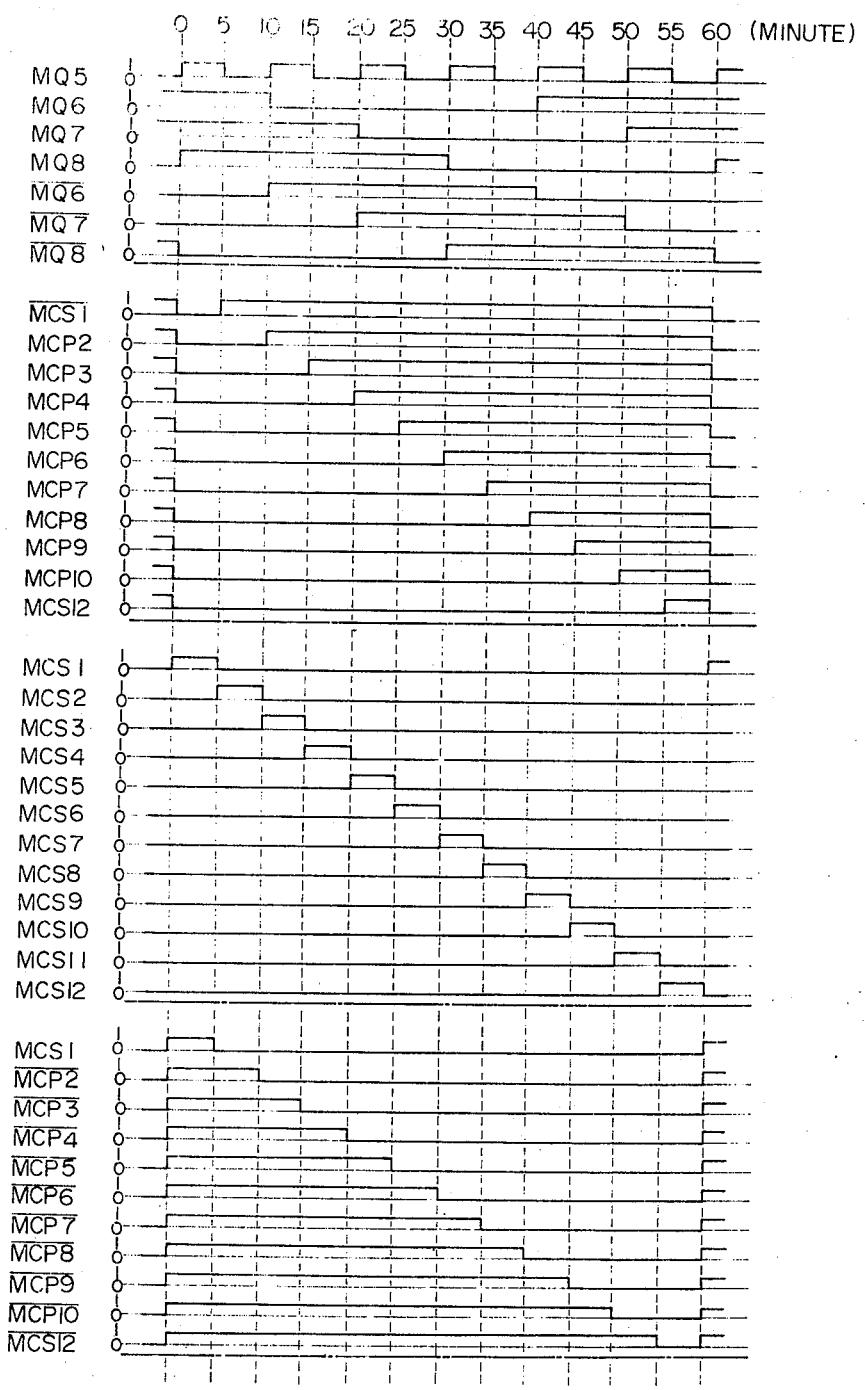
FIG. 20 is a time chart of further signals for explaining the system of FIG. 17.

The details of the second counter circuit 18 for producing the above-mentioned control pulse signals will now be described. This second counter circuit 18 comprises in part a counter circuit 30 and in part a plurality of logic gate circuits. Said counter circuit 30 includes a five-stage Johnson Counter 31, which comprises a series of five Delay Type flip-flops 32, 33, 34, 35 and 36 connected in sequence, and a three stage Johnson Counter 37 which comprises a series of three Delay Type flip-flops 38, 39 and 40 connected in sequence. The output terminals of the Johnson Counter 31 are connected respectively to the input terminals of the Johnson Counter 37. Said counter circuit 30 receives one pulse signal per minute from the output of the counter circuit 17 and divides it into one pulse signal per hour, counting 60 minutes. From the output terminals (Q32, $\overline{Q}$32), (Q33, $\overline{Q}$33), (Q34, $\overline{Q}$34), (Q35, $\overline{Q}$35) and (Q36, $\overline{Q}$36) of each of the flip-flops in the Johnson Counter 31, the output pulse signals (MQ1, $\overline{MQ1}$), (MQ2, $\overline{MQ2}$), (MQ3, $\overline{MQ3}$), (MA4, $\overline{MQ4}$) and (MQ5, $\overline{MQ5}$) are generated respectively. The output pulse signals MQ1, MQ2, . . . , and MQ5 have respectively one pulse signal per ten minutes and each signal is phase delayed by one-tenth of a time interval (namely one minute) from that of the previous pulse signal in sequence from the pulse signal MQ1, as shown by FIG. 18. The output pulse signals $\overline{MQ1}$, $\overline{MQ2}$, . . . , and $\overline{MQ5}$ have respectively a polarity reverse to that of the output pulse signals MQ1, MQ2, . . . , and MQ5, and have also respectively one pulse signal per 10 minutes and each signal is phase delayed by one-tenth of a time interval (namely 1 minute) from that of the previous pulse signal, in sequence from the pulse signal $\overline{MQ1}$, as shown by FIG. 18. In like manner, the output pulse signals (MQ6, $\overline{MQ6}$), (MQ7, $\overline{MQ7}$), and (MQ8, $\overline{MQ8}$) are generated from the output terminals (Q38, $\overline{Q38}$), (Q39, $\overline{Q39}$), and (Q40, $\overline{Q40}$) respectively of each of the flip-flops in the Johnson Counter 37. The output pulse signals $\overline{MQ6}$, $\overline{MQ7}$, and $\overline{MQ8}$ have respectively one pulse signal per 60 minutes, and each signal is phase delayed by one-sixth of a time interval (namely 10 minutes) from that of the previous pulse signal in sequence from the pulse signal $\overline{MQ6}$, as shown by FIG. 20. The output pulse signals $\overline{MQ6}$, $\overline{MQ7}$ and $\overline{MQ8}$ have respectively a polarity reverse to that of the output pulse signals MQ6, MQ7 and MQ8 and have also respectively one pulse signal per 60 minutes and each signal is phase delayed by one-sixth of a time interval (namely 10 minutes) from that of the previous pulse signals in sequence from the pulse signal $\overline{MQ6}$, as shown by FIG. 20.

The output terminals Q35 and Q36 are connected to the input terminals of a NOR gate 41 and this NOR gate 41 receives the output pulse signals MQ4 and MQ5. The output terminals (Q32, $\overline{Q34}$), (Q33, $\overline{Q33}$) and (Q34, $\overline{Q32}$) are connected respectively to the pair of transmission gates (42a, 42b), (43a, 43b) and (44a, 44b) and these pair or transmission gate receive respectively the output pulse signals (MQ1, $\overline{MQ3}$), (MQ2, $\overline{MQ2}$), and (MQ3, $\overline{MQ1}$). The output terminals $\overline{Q35}$ and $\overline{Q36}$ are connected to the input terminals of a NOR gate 45 and this NOR gate 45 receives the output pulse signals $\overline{MQ4}$ and $\overline{MQ5}$.

In the operation of the NOR gate 41, only when both the output pulse signals MQ4 and MQ5 represent a low level, namely binary 0, the NOR gate 41 produces an output representing a high level, namely binary 1. When at least one of the output pulse signals MQ4 and MQ5 represent a high level 1, the NOR gate 41 produces an output representing a low level 0. Accordingly, the output passing through the NOR gate 41 becomes the control pulse signals SMS1 as shown by FIG. 18. In the operation of the pair of transmission gates (71a, 71b), when the control pulse signal SMS1 represents a high level 1, an inverter 13 applies a signal representing a low level 0 to the transmission gates (71a, 71b), and the transmission gate 71a is closed and the transmission gate 71b is opened. While the transmission gate 71b is opened, the pulse signal VSeg 2 passes through the transmission gate 71b by way of the input terminal 11. When the control pulse signals SMS1 represents a low level 0, an inverter 13 applies a signal representing a high level 1 to the transmission gates (71a, 71b), and the transmission gate 71a is opened and the transmission gate 71b is closed. When the transmission gate 71a is opened, the pulse signal VSeg 1 passes through the transmission gate 71a by way of the input terminal 12.

Figure 19:
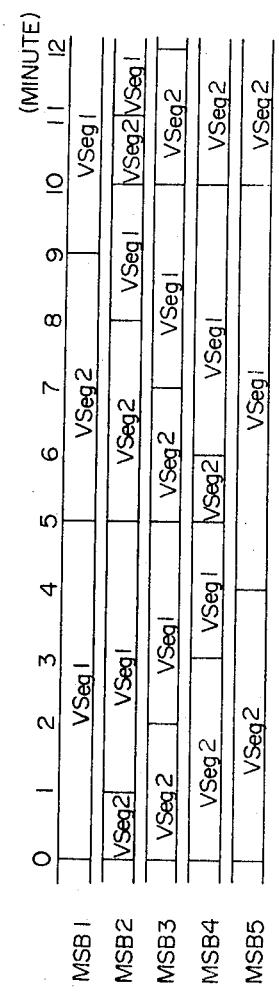
FIG. 19 is a time chart of the outputs of one switch set of FIG. 17.

Accordingly, the pulse signals passing through the pair of transmission gates (71a, 71b) become the driving pulse signal MSB1 as shown by FIG. 19. In the same way as the above-mentioned operation, the pair of transmission gates (75a, 75b) are also controlled to open any one of the gates thereof in accordance with the potential level, namely a high level or a low level, of the control pulse signal SMS5, so that the pulse signals VSeg 1 and VSeg 2 passing through the pair of transmission gates (75a, 75b) become the driving pulse signal MSB5 as shown in FIG. 19.

In the operation of the pair of transmission gates (42a, 42b), (43a, 43b) and (44a, 44b), these transmission gates are all controlled by the application of the output pulse signals (MQ5, $\overline{MQ5}$). When the pulse signal MQ5 represents a high level 1, the transmission gates 42a, 43a, and 44a are all opened and the transmission gates 42b, 43b and 44b are all closed. Accordingly, the output pulse signals MQ1, MQ2, and MQ3 pass respectively through the transmission gates 42a, 43a and 44a. When the pulse signal MQ5 represents a low level 0, the transmission gates 42a, 43a and 44a are all closed and the transmission gates 42b, 43b, and 44b are all opened. Accordingly, the output pulse signals $\overline{MQ3}$, $\overline{MQ2}$ and $\overline{MQ1}$ pass respectively through transmission gates 42b, 43b and 44b. In this way, the output pulse signals passing through the pair of transmission gates (42a, 42b), (43a, 43b) and (44a, 44b) become respectively the control pulse signals SMS2, SMS3 and SMS4 as shown by FIG. 18. These control pulse signals SMS2, SMS3 and SMS4 are transmitted respectively to the pair of transmission gates (72a, 72b), (73a, 73b) and (74a, 74b) through an inverter 13. The operation of the pair of transmission gates (72a, 72b), (73a, 73b) and (74a, 74b) is the same as that of the pair of transmission gates (71a, 71b) and (75a, 75b) described above. Accordingly, the pulse signals passing through these transmission gates (72a, 72b), (73a, 73b) and (74a, 74b) become respectively the driving pulse signals MSB2, MSB3 and MSB4 as shown by FIG. 19. Thus, the driving pulse signals MSB1, MSB2, . . . , and MSB5 are produced and applied respectively to the segment electrodes S1, S2, . . . , and S5.

On the other hand, the output terminals (Q38, $\overline{Q38}$), (Q39, $\overline{Q39}$) and (Q40, $\overline{Q40}$) are connected respectively to the input terminals of the respectively predetermined NAND gates 46 and NOR gates 47 and an inverter 48 shown in detail in FIG. 17. These logic gate circuits receive the predetermined output pulse signals MQ5, (MQ6, $\overline{MQ6}$), (MQ7, $\overline{MQ7}$) and (MQ8, $\overline{MQ8}$) respectively transmitted from the input terminal of each of the flip-flops 36, 38, 39 and 40. For example, NAND gate 46a which produces the control pulse signal $\overline{MCS1}$ receives the output pulse signals MQ5, MQ6 and MQ8. In the operation of this NAND gate 46a, only when all the output pulse signals MQ5, MQ6 and MQ8 represent a high level 1, the NAND gates 46a produces an output representing a low level 0. When at least one of the output pulse signals MQ5, MQ6 and MQ8 represents a low level 0, the NAND gate 46a produces an output representing a high level 1. Accordingly, the output passing through this NAND gate 46a becomes the control pulse signal $\overline{MSC1}$ as shown by FIG. 20. This control pulse signal $\overline{MCS1}$ is applied to the pair of transmission gates (601a, 601b) of the dual bi-directional switch 601 and the transmission gate 602c of the triple bilateral switch 602. When this control pulse signal $\overline{MCS1}$ represents a low level 0, an inverter 13 applies the control pulse signal MCS1 representing a high level 1 to the transmission gates 601a, 601b and 602c, and the transmission gate 601a is closed and the transmission gates 601b and 602c are opened. While the transmission gates 601b and 602c are opened the pulse signals VCom 2 and VCom 3 pass respectively through the transmission gates 601b and 602c by way of the input terminal 9 and 10. When the control pulse signal MCS1 represents a high level 1, an inverter 13 applies the control pulse signal MCS1 representing a low level 0 to the transmission gates 601a, 601b, and 602c, and the transmission gate 601a is opened and the transmission gates 602b and 602c are closed. When the transmission gate 601a is opened, the pulse signal VCom 1 passes through the transmission gate 601a by way of the input terminal 8. In other words, when the control pulse signal $\overline{MCS1}$ represents a high level 1, the pulse signal VCom 1 passes through the transmission gate 601a, and when the control pulse signal MCS1 represents a high level 1, the pulse signal VCom 2 passes through the transmission gate 601b. In this way, the pulse signals passing through the pair of transmission gates (601a, 601b) become the driving pulse signal MCB1 as shown by FIG. 21.

Further, the NAND gate 46b which produces the control pulse signal $\overline{MCS2}$ receives the output pulse signals MQ6, MQ8 and the control pulse signals $\overline{MCS1}$. In the operation of this NAND gate 46b, the NAND gate 46b produces an output representing a low level 0 only when all the pulse signals MQ6, MQ8 and $\overline{MCS1}$ represent a high level 1. When at least one of the pulse signals MQ6, MQ8 and $\overline{MCS1}$ represents a low level 0, the NAND gate 46b produces an output representing a high level 1. This control pulse signal $\overline{MCS2}$ becomes the control pulse signal MCS2 after passing through an inverter 13, as shown by FIG. 20. When this control pulse signal MCS2 represents a high level 1, the transmission gate 602b is opened. When the transmission gate 602b is opened, the pulse signal VCom 2 passes through the transmission gate 602b by way of the input terminal 9. The NOR gate 47a which produces the control pulse signal $\overline{MCP2}$ receives the output pulse signals $\overline{MQ6}$ and $\overline{MQ8}$. In the operation of this NOR gate 47a, the NOR gate 47a produces an output representing a high level 1, only when both the output pulse signals $\overline{MQ6}$ and $\overline{MQ8}$ represent a low level 0. When at least one of the output pulse signals $\overline{MQ6}$ and $\overline{MQ8}$ represents a high level 1, the NOR gate 47a produces an output representing a low level 0. Accordingly, the output passing through this NOR gate 47a becomes the control pulse signal $\overline{MCP2}$ as shown by FIG. 20. This control pulse signal $\overline{MCP2}$ is applied to the pair of transmission gates 602a and 603c. When this control pulse signal $\overline{MCP2}$ represents a high level 1, an inverter 13 applies the control pulse signal MCP2 representing a low level 0 to the transmission gates 602a and 603c, and the transmission gate 602a is closed and the transmission gate 603c is opened. While the transmission gate 603c is opened, the pulse signal VCom 3 passes through the transmission gate 603c by way of the input terminal 10. When this control pulse signal $\overline{MCP2}$ represents a low level 0, an inverter 13 applies the control pulse signal MCP2 representing a high level 1 to the transmission gate 602a and 603c, and the transmission gate 602a is opened and the transmission gate 603c is closed. While the transmission gate 602a is opened, the pulse signal VCom 1 passes through the transmission gate 602a by way of the input terminal 8. In other words, the pulse signal VCom 1 passes through the transmission gate 602a when the control pulse signal MCP2 represents a high level 1 and the pulse signal VCom 2 passes through the transmission gate 602b when the control pulse signal MCS2 represents a high level 1, and the pulse signal VCom 3 passes through the transmission gate 602c when the control pulse signal MCS1 represents a high level 1. Accordingly, the pulse signals VCom 1, VCom 2 and VCom 3 passing through the three transmission gates (602a, 602b and 602c) of the triple bilateral switch 602 become the driving pulse signal MCB2 as shown in FIG. 21.

Figure 21:
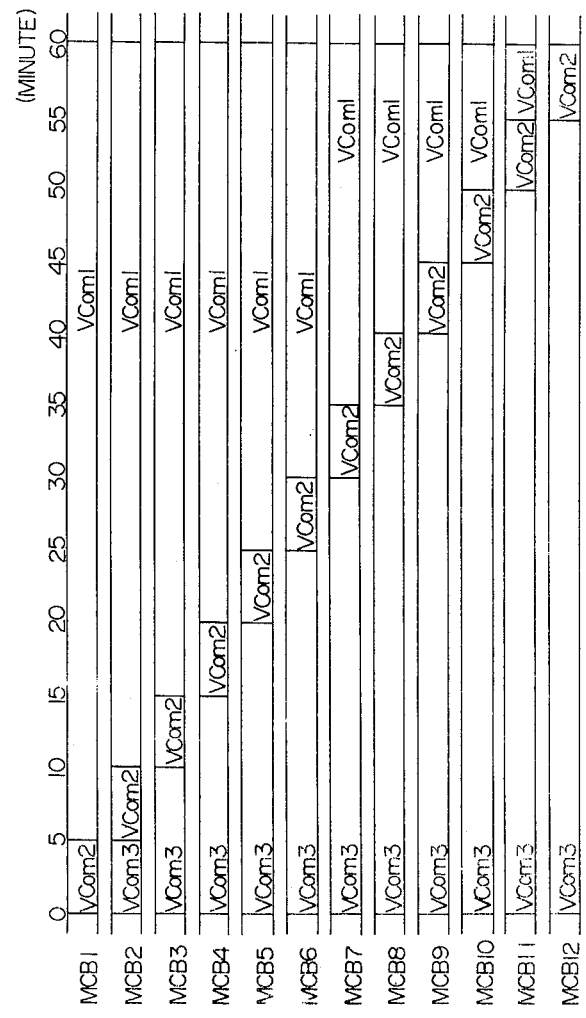
FIG. 21 is a time chart of the outputs of the other switch set of FIG. 17.

By the same operations as described above, the driving pulse signals MCB3, MCB4, . . . , and MCB12 respectively as shown in FIG. 21 are also produced. These driving pulse signals MCB1, MCB2, . . . , and MCB12 are applied to the common electrodes C1, C2, . . . , and C12, respectively.

Considering the first display element which has a segment electrode S1 and a common electrode C1, the segment electrode S1 is supplied the driving pulse signal MSB1 and the common electrode C1 is supplied the driving pulse signal MCB1. During the time interval from 0 to 5 minutes, the segment electrode S1 is supplied the pulse signal VSeg 1 and the common electrode C1 is supplied the pulse signal VCom 2. During this time interval, the first display element is turned ON. During the time interval from 5 to 60 minutes, although the segment electrode S1 is supplied the pulse signal VSeg 2 and VSeg 1 in turn, as the common electrode C1 is supplied the pulse signal VCom 1, the first display element remains in the ON state regardless of the application of the pulse signals VSeg 1 and VSeg 2. Accordingly, the first display element is turned ON continuously all the time.

Considering the second display element which has a segment electrode S2 and a common electrode C1, the segment electrode S2 is supplied the driving pulse signal MSB2, and the common electrode C1 is supplied the driving pulse signal MCB1. During the time interval from 0 to 1 minute, the segment electrode S2 is supplied the pulse signal VSeg 2 and the common electrode C1 is supplied the pulse signal VCom 2. During this time interval, the second display element is turned OFF. During the time interval from 1 to 60 minutes, by the same process as the case of the first display element described above, this second display element is turned ON continuously. Accordingly, the second display element is turned OFF only during the time interval from 0 to 1 minute and is in the ON state during the time interval from 1 to 60 minutes. In like manner, the third display element is turned OFF only during the time interval from 0 to 2 minutes and is in the ON state during the time interval from 2 to 60 minutes. In this way, all the 60 display elements are turned ON one by one in sequence every 1 minute and is in the ON state during the respective remaining time intervals. Regarding the last display element which has a segment electrode S5 and a common electrode C12, the segment electrode S5 is supplied the driving pulse signal MSB5 and the common electrode C12 is supplied the driving pulse signal MCB12. During the time interval from 0 to 55 minutes, although the segment electrode S5 is supplied the pulse signals VSeg 2 and VSeg 1 in turn, as the common electrode C12 is always supplied the pulse signal VCom3, the last display element is in the OFF state regardless of the application of the pulse signal VSeg 1 and VSeg 2. And during the time interval from 55 to 59 minutes, the segment electrode S5 is supplied the pulse signal VSeg 2 and the common electrode C12 is supplied the pulse signal VCom 2. During this time interval, the last display element is still turned OFF. Further, during the time interval from 59 to 60 minutes, the segment electrode S5 is supplied the pulse signal VSeg 1 and the common electrode C12 is supplied the pulse signal VCom 2. During the time interval, the last display element is turned ON at last. Accordingly, the last display element is in the OFF state continuously during the time interval from 0 to 59 minutes and is turned ON only during the time interval from 59 to 60 minutes.

It should be clear from the explanation above that 60 display elements can be turned ON one by one every 1 minute sequentially and be in the ON state accumulatively. It is greatly advantageous for the recognition of an analogical time indication that the display device having above-mentioned display elements can be employed for the minute indication of a timepiece.

As detailed herein, when the display body 2 is provided with sixty display elements 1, it is possible to minimize the total numbers of leads to 16 leads by dividing said display elements 1 into 10 blocks 3 each of which comprising six display elements 1. Alternatively, although the total number of leads becomes 17, which is only one lead more as compared with the foregoing. This is advantageous in the application of this invention for time indication of horologes where said display elements 1 are provided with 12 blocks 3 each of which comprising five display elements 1. Therefore, the present invention fulfills not only the object that a great many display elements 1 can be turned ON sequentially and accumulatively in order to represent analogically expressed quantity by counting numbers of said display elements 1 turning ON, but also another object that the total numbers of leads and switches can be extremely reduced.

It will thus be seen that the objects set forth above among those made apparent from the preceding description are efficiently attained and since certain changes may be made in the display means for the liquid crystal without departing from the scope of the invention, it is intended that all matters contained in the above description or shown in the accompanying drawings shall be interpreted as illustrative and not in a limiting sense.

What is claimed is:

1. A liquid crystal display device comprising a plurality of display elements each said display element comprising a layer of liquid crystal material arranged between a pair of electrode plates, said display elements being connected to an electronic circuit comprising a pulse-generating means and a switching means, said pulse-generating means adapted to generate a plurality of drive pulse signals for exciting said liquid crystal material to selectively turn said display elements ON and OFF and a plurality of control pulses for operating said switching means, said plurality of drive pulse signals comprising two groups of pulse signals for application to said display elements, the first of said groups comprising three different drive pulse signals and the second of said groups comprising two different drive pulse signals, and said switching means adapted to select one of said drive pulse signals from each of said first and second groups for application one to each electrode plate of said pair of electrode plates, said selected drive pulses being combined to produce a plurality of combined pulses, said combined pulses comprising two different pulse combinations, one of said pulse combinations above the threshold value of said liquid crystal material in effective voltage and one of said pulse combinations below the threshold value of the liquid crystal material in effective voltage.

2. A liquid crystal display device as set forth in claim 1, wherein said pulse-generating means comprises a first counter circuit.

3. A liquid crystal display device as set forth in claim 2, wherein said first counter circuit includes a Johnson Counter.

4. A liquid crystal display device as set forth in claim 1, wherein said plurality of drive pulses are provided with high frequency pulses beyond the response region of the liquid crystal and low frequency pulses within the response region of the liquid crystal.

5. A liquid crystal display device as set forth in claim 1, wherein said pulse-generating means comprises a second counter circuit which is coupled to said first counter circuit.

6. A liquid crystal display device as set forth in claim 5, wherein said counter circuit is provided with a Johnson Counter.

7. A liquid crystal display device as set forth in claim 5, wherein said second counter circuit produces said plurality of control pulses.

8. A liquid crystal display device as set forth in claim 1, wherein said display elements are provided with a plurality of segment electrodes which are combined and belong to the individual blocks whereby each of the segment electrodes within one block is electrically interconnected to corresponding each of the segment electrodes within another block, and same members of common electrodes as there are said blocks are positioned opposite to said blocks of segment electrodes.

9. A liquid crystal display device as set forth in claim 8, wherein said individual blocks of segment electrodes are provided with equal number of single segment electrodes.

10. A liquid crystal display device as set forth in claim 9, wherein said display elements comprise 60 segment electrodes which are combined and belong to 10 blocks each having six single segment electrodes.

11. A liquid crystal display device as set forth in claim 9, wherein said display elements comprise 60 segment electrodes which are combined and belong to 12 blocks each having five single segment electrodes.

12. A liquid crystal display device as set forth in claim 9, wherein the electrical connection leads between the individual electrodes of different blocks are meandering whereby in adjacent blocks the two respective electrodes are interconnected and said electrodes are arranged symmetrically with respect to the boundary between these two blocks.

13. A liquid crystal display device as set forth in claim 1 wherein said plurality of drive pulses are each in a different phase in sequence.

14. A liquid crystal display device as set forth in claim 13 wherein said first group comprises three different drive pulses each having a different phase of three quarters of a period in sequence and said second group comprises two different drive pulses having a different phase of one quarter of a period in sequence.

15. A liquid crystal display device as set forth in claim 1, wherein said pulse-generating means produces at least one drive pulse signal having a different period from the other drive pulse signals.

16. A liquid crystal display device as set forth in claim 15, wherein at least one of said drive pulse signals includes at least one drive pulse signal with a period that differs from the other drive pulse signals within the same pulse group.

17. A liquid crystal display device as set forth in claim 1, wherein said pulse-generating means produces at least one drive pulse signal having a different wave form from the other drive pulse signals.

18. A liquid crystal display device as set forth in claim 17, wherein at least one of said drive pulse signals includes at least one drive pulse signal with a wave form that differs from the other drive pulse signals within the same pulse group.

19. A liquid crystal display device as set forth in claim 1, wherein said switching means is controlled by said plurality of control pulses transmitted from said second counter circuit.

20. A liquid crystal display device as set forth in claim 19, wherein said switching means comprises a plurality of electronic switches.

21. A liquid crystal display device as set forth in claim 20, wherein said plurality of electronic switches are respectively provided with a plurality of sets of three bilateral switches for switching said first group of drive pulse signals, and a plurality of sets of two bi-directional switches for switching said second group of drive pulse signals.

22. A liquid crystal display device as set forth in claim 21, wherein said sets of three bilateral switches and sets of two bi-directional switches include respectively a plurality of logic gates equipped with switching operation to select the responsive ones of drive pulse signals from said groups of three different drive pulse signals and two different drive pulse signals and to apply said selected drive pulse signals to said pair of electrode plates.

23. A liquid crystal display as set forth in claim 22 wherein said plurality of logic gates include a plurality of transmission gates.

24. An electronic time display device comrising a plurality of liquid crystal display elements, each display element comprising a layer of liquid crystal material, said display elements including a plurality of like segment electrodes arranged in series and at least one common electrode, pulse-generating means, a first switching means, at least one said common electrode connected to said first switching means, a second switching means, said segment electrodes connected to said second switching means, said pulse-generating means adapted to generate a plurality of drive pulse signals for exciting said liquid crystal material to selectively turn said display elements ON and OFF and a plurality of control pulses for operating said first and second switching means, said plurality of drive pulse signals comprising two groups of pulse signals for application to said display elements, the first of said groups comprising three different drive pulse signals and the second of said groups comprising two different drive pulse signals, and said first and second switching means adapted to select one of said drive pulse signals from each of said first and second groups for application one to each common and segment electrodes, said selected drive pulses being combined to produce a plurality of combined pulses, said combined pulses comprising two different pulse combinations, one of said pulse combinations above the threshold value of said liquid crystal material in effective voltage and one of said pulse combinations below the threshold value of the liquid crystal material in effective voltage, a first counter, said drive pulses produced by said first counter, a second counter, said first and second switches being controlled by said second counter, whereby said display elements are energized sequentially and accumulatively.

* * * * *